(12) United States Patent
Hu

(10) Patent No.: US 12,408,358 B2
(45) Date of Patent: Sep. 2, 2025

(54) SEMICONDUCTOR STRUCTURE AND FORMATION METHOD THEREOF

(71) Applicant: CHANGXIN MEMORY TECHNOLOGIES, INC., Hefei (CN)

(72) Inventor: Jiancheng Hu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 294 days.

(21) Appl. No.: 17/647,900

(22) Filed: Jan. 13, 2022

(65) Prior Publication Data

US 2022/0140071 A1 May 5, 2022

Related U.S. Application Data

(63) Continuation of application No. PCT/CN2021/100064, filed on Jun. 15, 2021.

(30) Foreign Application Priority Data

Sep. 29, 2020 (CN) .......................... 202011047212.7

(51) Int. Cl.
  *H10D 1/68* (2025.01)
  *H10B 12/00* (2023.01)
(52) U.S. Cl.
  CPC ........... *H10D 1/716* (2025.01); *H10B 12/033* (2023.02)
(58) Field of Classification Search
  None
  See application file for complete search history.

(56) References Cited

U.S. PATENT DOCUMENTS

| 5,077,688 A | 12/1991 | Kumanoya et al. |
| 6,071,774 A | 6/2000 | Sung |
| 2006/0202250 A1 | 9/2006 | Hecht et al. |
| 2010/0230787 A1 | 9/2010 | Guiraud et al. |
| 2022/0140071 A1* | 5/2022 | Hu .......................... H10D 1/716 257/296 |

FOREIGN PATENT DOCUMENTS

| CN | 109075164 A | 12/2018 |
| CN | 110459533 A | 11/2019 |

OTHER PUBLICATIONS

International Search Report as cited in PCT Application No. PCT/CN2021/100064 mailed Sep. 23, 2021, 8 pages.
Written Opinion cited in PCT/CN2021/100064, mailed on Sep. 23, 2021, 6 pages.

* cited by examiner

*Primary Examiner* — Jack S Chen
(74) *Attorney, Agent, or Firm* — Syncoda LLC; Feng Ma

(57) ABSTRACT

A semiconductor structure and a formation method thereof are provided. The formation method includes: forming a plurality of lower electrodes on a base, the lower electrode including a ring-like wall and a petal-like wall extending along a direction perpendicular to a surface of the base, and the petal-like wall dividing the ring-like wall internally into a plurality of discrete first openings; forming a dielectric layer on a bottom and a sidewall of the first opening; and forming an upper electrode in the first opening, the dielectric layer being located between the lower electrode and the upper electrode. The lower electrode according to the present application includes the ring-like wall and the petal-like wall, so that a surface area of the lower electrode is increased.

11 Claims, 6 Drawing Sheets

SEMICONDUCTOR STRUCTURE AND FORMATION METHOD THEREOF

CROSS-REFERENCE TO RELATED APPLICATIONS

This application is a continuation application of International Patent Application No. PCT/CN2021/100064, filed on Jun. 15, 2021, which claims priority to Chinese Patent Application No. 202011047212.7, filed with the Chinese Patent Office on Sep. 29, 2020 and entitled "SEMICONDUCTOR STRUCTURE AND FORMATION METHOD THEREOF." International Patent Application No. PCT/CN2021/100064 and Chinese Patent Application No. 202011047212.7 are incorporated herein by reference in their entireties.

TECHNICAL FIELD

The present application relates to the field of semiconductor manufacturing, and in particular, to a semiconductor structure and a formation method thereof.

BACKGROUND

A Dynamic Random Access Memory (DRAM) is a semiconductor memory device commonly used in computers, and consists of a plurality of memory cells. Each memory cell generally includes a transistor and a capacitor. The transistor has a gate electrically connected to a wordline, a source electrically connected to a bitline and a drain connected to the capacitor. A wordline voltage on the wordline can control ON and OFF of the transistor so that data information stored in the capacitor can be read through the bitline or data information is written to the capacitor for storage through the bitline.

As the process continues to evolve, the integration of the DRAM is constantly increased, an element size is constantly miniaturized, and charge storage capacity of the capacitor is also facing challenges. A capacitance value of the capacitor is required to be improved urgently.

SUMMARY

According to some embodiments, in one aspect, the present application provides a semiconductor structure formation method, including:
 providing a base;
 forming a plurality of lower electrodes on the base, the lower electrode including a ring-like wall and a petal-like wall extending along a direction perpendicular to a surface of the base, and the petal-like wall dividing the ring-like wall internally into a plurality of discrete first openings;
 forming a dielectric layer on a bottom and a sidewall of the first opening; and
 forming an upper electrode in the first opening, the dielectric layer being located between the lower electrode and the upper electrode.

According to some embodiments, in another aspect, the present application provides a semiconductor structure, including:
 a base;
 a plurality of lower electrodes located on the base, the lower electrode including a ring-like wall and a petal-like wall, the ring-like wall and the petal-like wall extending along a direction perpendicular to a surface of the base, and the petal-like wall dividing the ring-like wall internally into a plurality of discrete openings;
 a dielectric layer located on a bottom and a sidewall of the opening; and
 an upper electrode filling the opening, the dielectric layer being located between the lower electrode and the upper electrode.

DESCRIPTION OF EMBODIMENTS

As stated in the Background, a capacitance value of an existing semiconductor structure still needs improvement.

To this end, embodiments of the present application provide a semiconductor structure and a formation method thereof. The formation method includes: providing a base; forming a plurality of lower electrodes on the base, the lower electrode including a ring-like wall and a petal-like wall extending along a direction perpendicular to a surface of the base, and the petal-like wall dividing the ring-like wall internally into a plurality of discrete first openings; forming a dielectric layer on a bottom and a sidewall of the first opening; and forming an upper electrode in the first opening, the dielectric layer being located between the lower electrode and the upper electrode. The lower electrode according to the present application includes the ring-like wall and the petal-like wall, so that a surface area of the lower electrode is increased. When the dielectric layer and the corresponding upper electrode are subsequently formed on the lower electrode, surface areas of the dielectric layer and the upper electrode may also be increased correspondingly, thereby increasing a capacitance value of the semiconductor structure formed.

A specific implementation of the present application is described in detail below with reference to the accompanying drawings. When the embodiments of the present application are described in detail, for ease of description, the schematic diagrams may not be partially enlarged to normal proportions, and the schematic diagrams are examples only, which should not limit the protection scope of the present application herein. In addition, three-dimensional dimensions of length, width and depth should be included in actual manufacturing.

Figure 1:
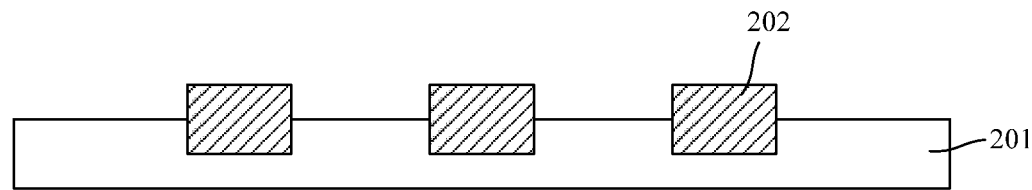
FIG. 1 to FIG. 14 are schematic structural diagrams of a semiconductor structure formation method according to embodiments of the present application.
Figure 2:
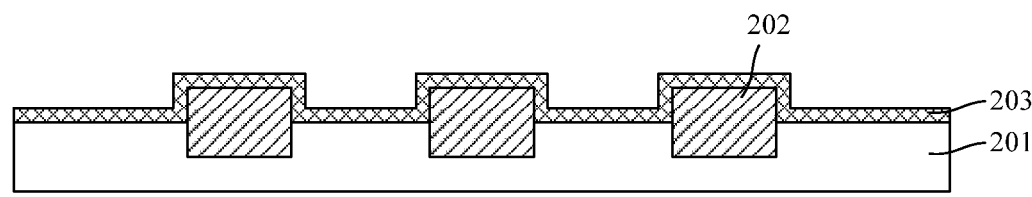

Referring to FIG. 1, a base 201 is provided.

In one embodiment, the base 201 may include a semiconductor substrate and an interlayer dielectric layer located on the semiconductor substrate.

The semiconductor substrate may be made of silicon (Si), germanium (Ge), silicon germanium (GeSi), or silicon carbide (SiC); or silicon on insulator (SOI), germanium on insulator (GOI); or other materials, such as gallium arsenide and other III-V compounds. In this embodiment, the semiconductor substrate is a silicon substrate.

The semiconductor substrate has active regions, and a trench isolation structure isolating the active regions. A semiconductor device may be formed on the active region of the semiconductor substrate. The semiconductor substrate includes a planar transistor or a trench transistor.

The interlayer dielectric layer may also be formed on the semiconductor substrate. A connection line connecting the planar transistor or the trench transistor to a subsequently-formed semiconductor structure may be formed in the interlayer dielectric layer. The connection line includes one or any combination of a metal plug, a metal wire, a pad and a conductive connection structure (doped polysilicon). The interlayer dielectric layer may be of a monolayer or multi-layer stack structure. The interlayer dielectric layer may be made of silicon oxide, silicon nitride, silicon oxynitride, FSG (Fluorinated Silica Glass), BSG (Boron Silicate Glass), PSG (Phosphor Silica Glass), BPSG (Boron-Phosphor Silicate Glass), a low dielectric constant material, or other suitable materials and/or combinations thereof.

In one embodiment, a contact pad 202 is formed on the base 201. Specifically, the contact pad 202 may be formed in the interlayer dielectric layer of the base 201. The contact pad 202 is configured to connect a subsequently-formed lower electrode layer of the semiconductor structure. For example, the plurality of contact pads 202 may be arranged in a same manner as the subsequently-formed lower electrodes.

In one embodiment, the contact pad 202 has a convex portion protruding from the surface of the base. When the lower electrode is subsequently formed on the contact pad 202, a lower part of the ring-like wall of the lower electrode may be wrapped around a sidewall of the convex portion, so that the lower electrode and the contact pad 202 have a larger contact area, making the lower electrode not prone to tilt or position offset.

The contact pad 202 may be made of any one or any combination of W, Cu, Ti, Ni, Al, Co, TiN and metal silicides. The contact pad 202 may be formed by depositing a conductive layer and then etching the conductive layer or formed by an electroplating process.

In one embodiment, a first barrier layer 203 is further formed on surfaces of the base 201 and the contact pad 202. The first barrier layer 203 may be configured to perform any one or more of the following: prevent outward diffusion of the metal in the contact pad 202, reduce contact resistance between the contact pad 202 and the subsequently-formed lower electrode, and enhance adhesion between the contact pad 202 and the subsequently-formed lower electrode. The first barrier layer 203 may be made of one or more of Ti, Ta, TiN and TaN, and may be formed by a sputtering or deposition process.

Figure 3:
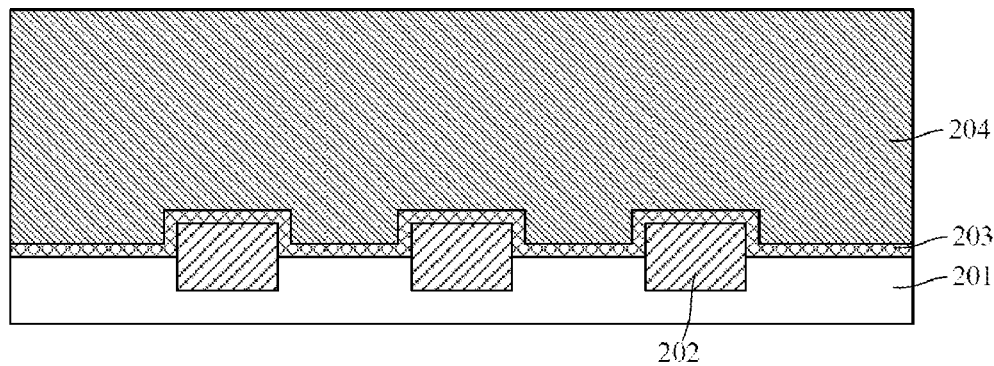

Referring to FIG. 3, a first conductive layer 204 is formed on the base 201.

The first conductive layer 204 is configured to subsequently form a first conductive post 215.

The first conductive layer 204 is made of any one or any combination of a conductive semiconductor material, a conductive polymer material and a conductive amorphous material.

In some embodiments, the doped semiconductor material may be silicon or germanium doped with impurity ions, the impurity ions may be P-type impurity ions or N-type impurity ions, the P-type impurity ions may be one or more of boron ions, gallium ions and indium ions, and the N-type impurity ions may be phosphorus ions, arsenic ions or antimony ions.

In one embodiment, the conductive polymer may be a conductive carbon backbone polymer, a hydrocarbon silicate backbone polymer, or a combination thereof.

In one embodiment, the conductive amorphous material may be composed of about 55% to about 70% carbon atoms, about 5% or less nitrogen, oxygen, sulfur, metal atoms, semimetals (one or more of boron, silicon, arsenic, selenium, tellurium) and hydrogen.

Figure 4:
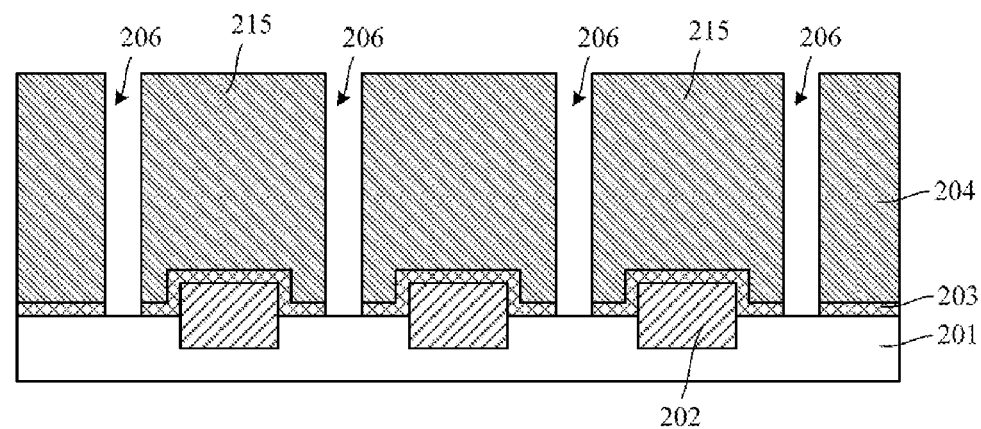
Figure 5:
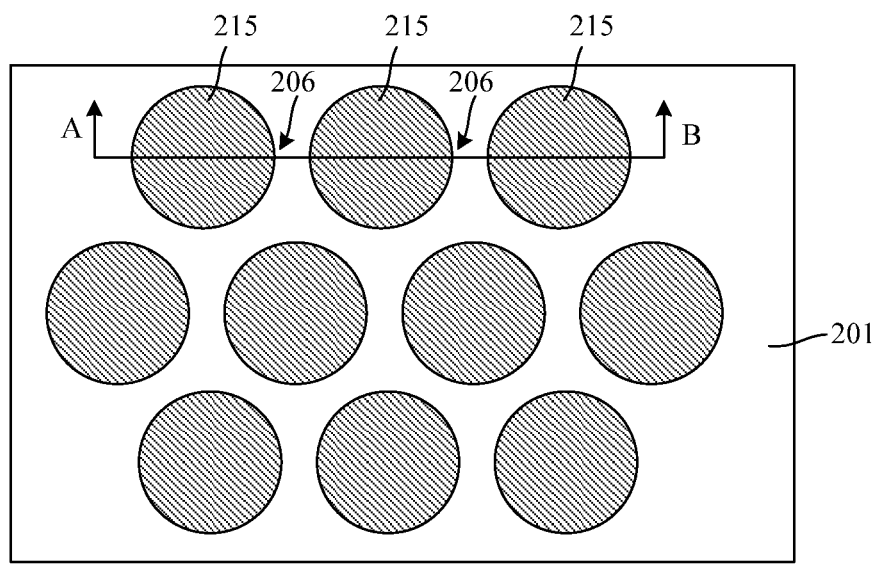

Referring to FIG. 4 and FIG. 5, FIG. 4 is a schematic diagram of a sectional structure taken along a direction AB of a cutting line in FIG. 5. The first conductive layer 204 is etched to form a plurality of first conductive posts 215 and second openings 206 between the first conductive posts 215.

The first conductive layer 204 may be etched by an anisotropic dry etching process, such as a plasma etching process. Before the first conductive layer 204 is etched, a patterned mask layer (not shown in the drawing) may be formed on a surface of the first conductive layer 204. The patterned mask layer exposes a region of the first conductive layer 204 required to be etched away.

In one embodiment, the first conductive post 215 is formed on the contact pad 202. The first conductive post 215 covers a top and a sidewall of the convex part of the contact pad 202, and the first barrier layer 203 is located between the first conductive post 215 and the contact pad 202. When the first conductive layer is etched, the first barrier layer 203 exposed at a bottom of the second opening 206 is also etched away, so that adjacent first conductive posts 215 are discrete and have no electrical connection there between.

In this embodiment, the first conductive post 215 has a shape of a cylinder, and the formed first conductive posts 215 are arranged in a honeycomb pattern.

In one embodiment, the first conductive post 215 has a shape of an elliptic cylinder or a square cylinder. Specifically, a cross section of the first conductive post 215 perpendicular to its extension direction has a shape of an ellipse or a square. In other embodiments, the shape of the cross section may not be limited and may be determined according to an actual process condition.

Figure 6:
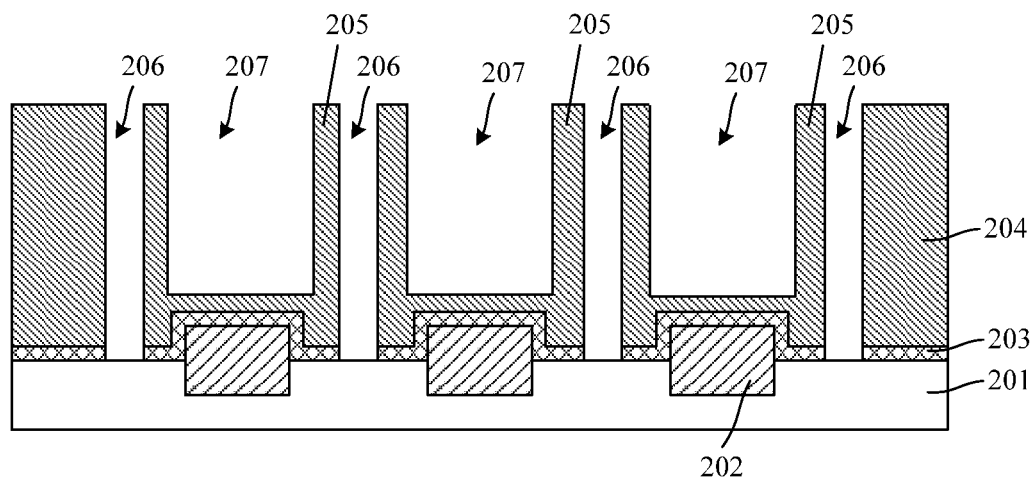
Figure 7:
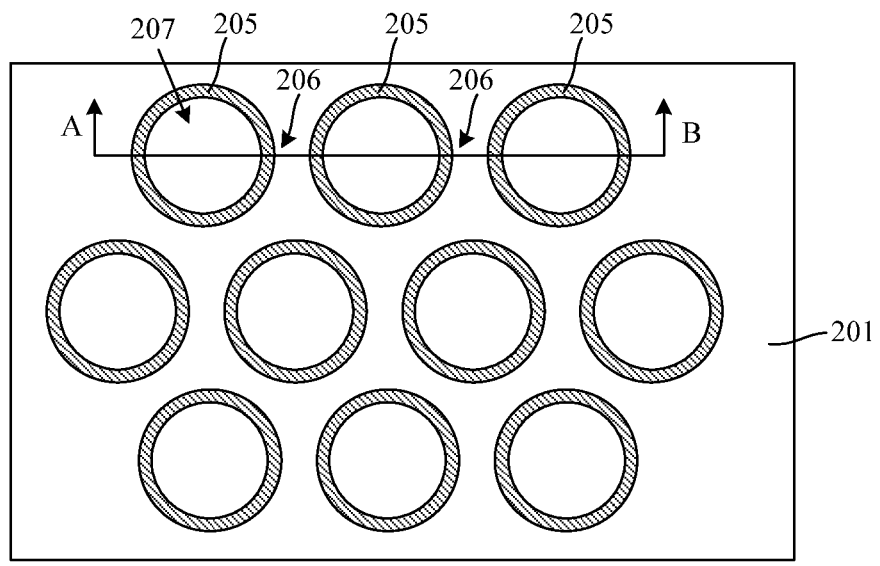

Referring to FIG. 6 and FIG. 7, FIG. 6 is a schematic diagram of a sectional structure taken along a direction AB of a cutting line in FIG. 7. The first conductive post 215 (refer to FIG. 5) is etched to form a ring-like wall 205 and a third opening 207.

In one embodiment, before the first conductive post 215 is etched, a first dielectric layer or sacrificial layer filling the second opening 206 may be formed. The first dielectric layer or sacrificial layer may be removed after the formation of the ring-like wall 205 or the subsequent formation of the petal-like wall. In other embodiments, before the first conductive post 215 is etched, a mask layer acting as a mask etching the first conductive post is formed on surfaces of the first conductive post 215 and the base. The mask layer fills the second opening 206.

The first conductive post 215 may be etched by an anisotropic dry etching process, such as a plasma etching process. For example, a mask opening is formed on the first conductive post 215. The mask opening exposes a central portion of the first conductive post 215. The central portion of the first conductive post 215 is etched using the mask opening to form the ring-like wall 205 and the third opening 207. Part of the first conductive post around an edge is retained as the ring-like wall 205. The third opening 207 is formed at a position where the first conductive post 215 is etched. The ring-like wall 205 may have a thickness of 1 nm to 10 nm. When the central portion of the first conductive post 215 is etched using the mask opening to form the third opening 207, the first barrier layer 203 or the contact pad 202 may be at a bottom of the third opening 207 formed; that is, the first barrier layer 203 or the contact pad 202 is used as an etch stop layer. In other embodiments, part of the first conductive post 215 may also be at the bottom of the third opening 207 formed. For example, an etch time is controlled so that the first conductive post 215 remaining at the bottom of the third opening 207 has a controllable thickness. Specifically, the first conductive post 215 remaining at the bottom of the third opening 207 has a same thickness as the ring-like wall 205.

In this embodiment, the formed ring-like wall 205 has a shape of a circular ring. In other embodiment, the ring-like wall 205 may have a shape of an elliptical ring, a square ring, or the like.

Figure 8:
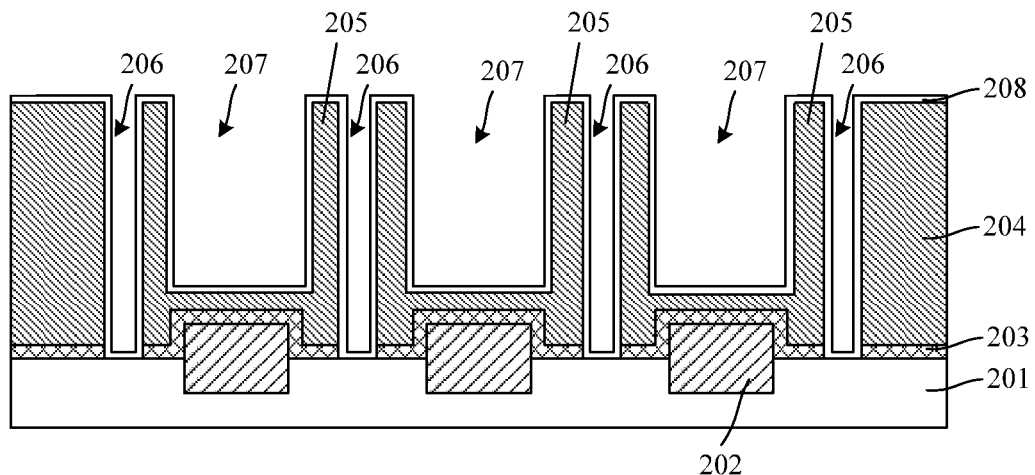

In one embodiment, referring to FIG. 8, prior to the step of filling the third opening 207 with the second conductive layer to form a second conductive post, the method further includes: forming a second barrier layer 208 on a surface of the ring-like wall 205.

The second barrier layer 208 may prevent outward diffusion of the material of the second conductive layer subsequently formed in the third opening 207 or improve contact resistance between the second conductive post and the ring-like wall or improve adhesion between second conductive post and the ring-like wall. The second barrier layer 208 may be made of one or more of Ti, Ta, TiN and TaN, and may be formed by a sputtering or deposition process.

In one embodiment, when the second opening 206 is not filled with the first dielectric layer or sacrificial layer, the second barrier layer 208 is also formed at a bottom and a sidewall of the second opening 206.

Figure 9:
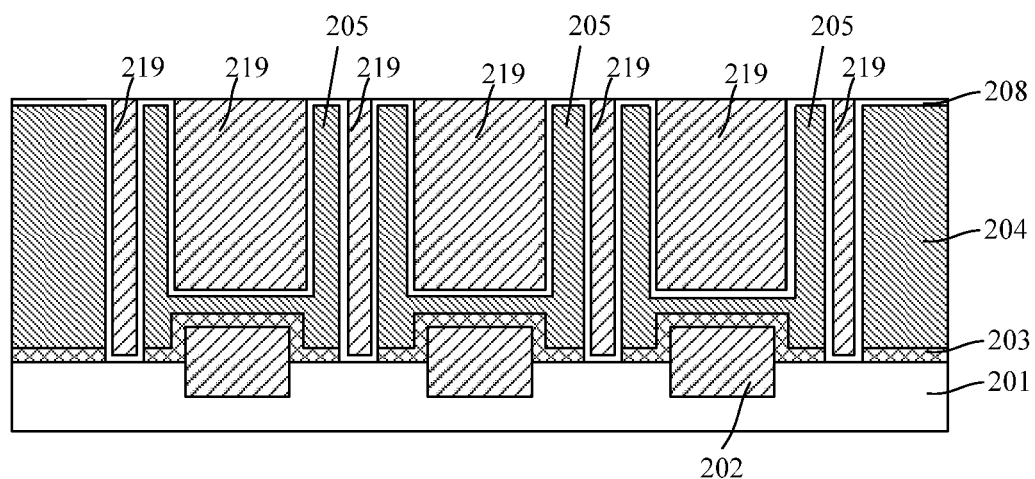

Referring to FIG. 9, the third opening 207 (refer to FIG. 8) is filled with the second conductive layer to form a second conductive post 219.

The second conductive post 219 is configured to subsequently form the petal-like wall of the lower electrode. Central axes of the formed second conductive post 219 and the first conductive post 215 may coincide, which can reduce the difficulty of a mask process for subsequently etching the second conductive post, and enable the shape of the petal-like wall in each lower electrode etched by the mask process to be consistent or slightly different.

The second conductive post 219 is made of a different material from the second barrier layer 208 and the ring-like wall 205, which, on the one hand, enables the second conductive post 219 to have a high etch selectivity ratio relative to the second barrier layer 208 and the ring-like wall 205 and enables the second barrier layer 208 and the ring-like wall 205 to be kept intact when the second conductive post 219 is subsequently etched to form the petal-like wall, and on the other hand, can reduce the difficulty of the mask process prior to the etching of the second conductive post 219.

In one embodiment, the second conductive post 219 is made of a conductive material containing a metallic element, such as W, Co, Ni, TiN or other suitable conductive materials.

In one embodiment, when the second opening 206 is not filled with the first dielectric layer or sacrificial layer, the second conductive layer further fills the second opening 206.

Figure 10:
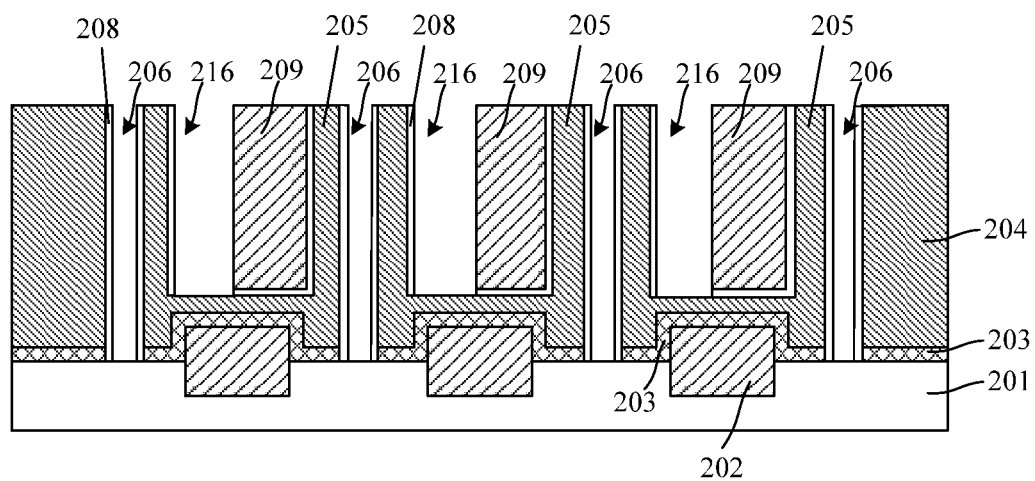
Figure 11:
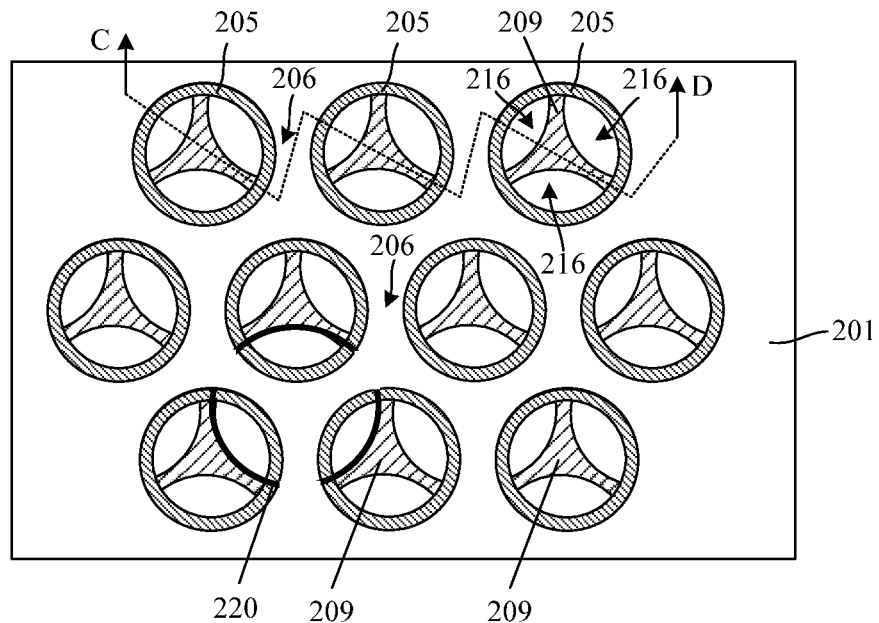

Referring to FIG. 10 and FIG. 11, FIG. 10 is a schematic diagram of a sectional structure taken along a direction CD of a cutting line in FIG. 11. A mask opening layer (not shown in the drawing) exposing part of the second conductive post 219 is formed above the second conductive post 219 (refer to FIG. 9). The second conductive post 219 is etched using the mask opening layer to form the petal-like wall 209.

The petal-like wall 209 divides the ring-like wall 205 internally into a plurality of discrete first openings 216. A plurality of lower electrodes are formed on the base 201. The lower electrode includes the ring-like wall 205 and the petal-like wall 209 located inside the ring-like wall 205. The lower electrode according to the present application includes special structures such as the ring-like wall 205 and the petal-like wall 209, so that a surface area of the lower electrode is increased. When the dielectric layer and the corresponding upper electrode are subsequently formed on the lower electrode, surface areas of the dielectric layer and the upper electrode may also be increased correspondingly, thereby increasing a capacitance value of the semiconductor structure formed.

Before the second conductive post 219 is etched, a mask opening layer is required to be formed on the second conductive post 219. The mask opening layer has an opening pattern. The opening pattern exposes some upper surfaces of a plurality of adjacent second conductive posts. For example, the opening pattern may be circular. The circular opening pattern exposes some upper surfaces of three adjacent second conductive posts. The mask opening layer covers only a surface of a to-be-retained portion of the second conductive post 219. Referring to FIG. 11, a region covered by the mask opening layer is a region corresponding to the petal-like wall 209. Other regions may be exposed. The mask opening layer has a circular opening pattern. A shape of a circular opening pattern 220 is shown in FIG. 11 with a full thick line. The circular opening pattern 220 exposes some upper surfaces of three adjacent second conductive posts. The circular opening pattern 220 may also expose surfaces of materials filling the ring-like wall 205 and the second opening 206 between adjacent second conductive posts (when the second conductive post is etched, an etch amount of the ring-like wall 205 is small or negligible since the ring-like wall 205 is made of a different material from the second conductive post). Therefore, when a process (mask process) for forming the mask opening layer is performed, a size of the circular opening pattern 220 formed in the mask opening layer may not be affected by a size (a smaller size) of a to-be-removed part in the second conductive post, thereby reducing the difficulty of the mask process. The second conductive post 219 can also be etched by the foregoing mask process to form the petal-like wall 209 even if the size of the to-be-removed part of the second conductive post is less than a minimum feature size of photolithography. Petal-like wall boundaries of the first opening 216 located in adjacent lower electrodes formed through the circular opening pattern 220 are on a same circumference.

In one embodiment, overlapping regions of the circular opening pattern and the second conductive post are the same in shape and size. In this embodiment, the second conductive post may overlap with three circular opening patterns. Therefore, the formed petal-like wall 209 divides the ring-like wall 205 internally into three first openings 216 the same in shape and size, which facilitates and simplifies the mask process while increasing the surface area of the lower electrode.

In one embodiment, when the material filling the second opening 206 is the second conductive layer, the second conductive layer in the second opening may be removed simultaneously when the second conductive post is etched, so that the second opening is re-exposed. A dielectric layer and an upper electrode layer can be subsequently formed in the second opening, so that a capacitor may also be formed among the dielectric layer and the upper electrode in the second opening and the adjacent ring-like wall 205, thereby further increasing a capacitive value of the semiconductor structure formed.

In one embodiment, when a second barrier layer 208 is formed on an inner wall of the ring-like wall 205, the second barrier layer 208 may be used as an etch stop layer when the second conductive post is etched. After the petal-like wall 209 is formed, a surface of the petal-like wall 209 can be nitrided, so that some materials on the surface of the petal-like wall 209 are nitrided, and a metal nitride (e.g., tungsten nitride) is formed on the surface of the petal-like wall 209. The metal nitride can further prevent diffusion of the metal in the petal-like wall 209 toward the dielectric layer, so as to ensure the isolation performance of the dielectric layer.

Figure 12:
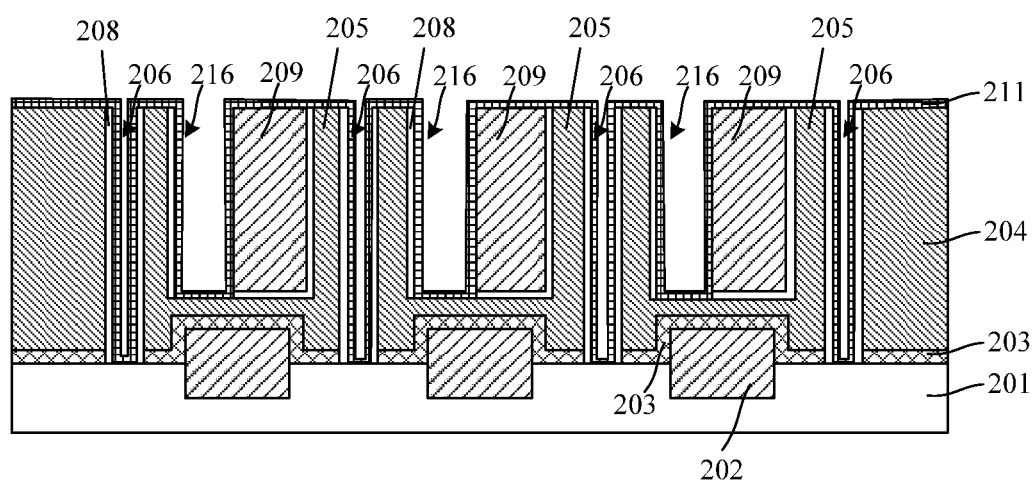

Referring to FIG. 12, a dielectric layer 211 is formed on a bottom and a sidewall of the first opening 216. The dielectric layer 211 may be made of a high-K dielectric material, so as to increase the capacitive value of the capacitor per unit area. The high-K dielectric material includes one of $ZrO_x$, $HfO_x$, $ZrTiO_x$, $RUO_x$, $SbO_x$ and $AlO_x$, or a lamination formed by more than two of the groups consisting of the above materials.

In one embodiment, the dielectric layer 211 is also formed on an outer wall and a top surface of the ring-like wall 205 and a top surface of the petal-like wall 209.

Figure 13:
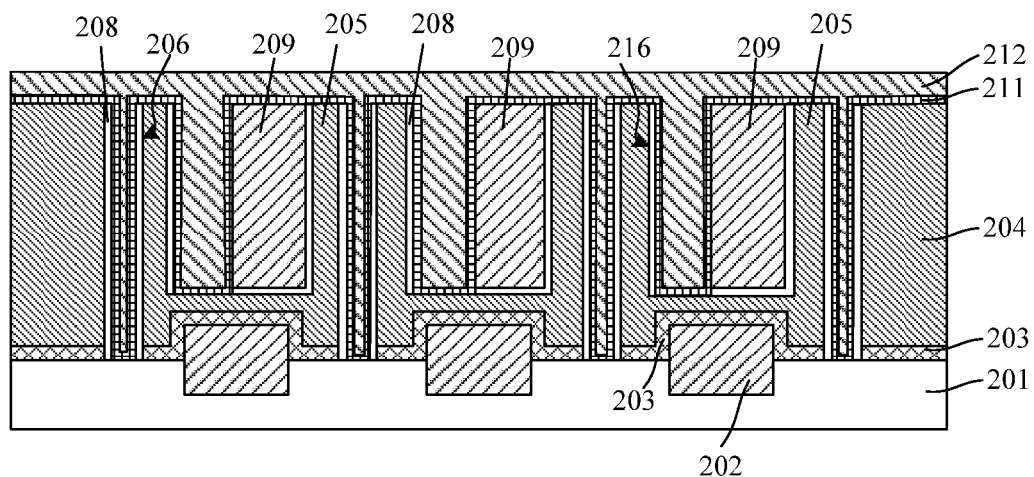
Figure 14:
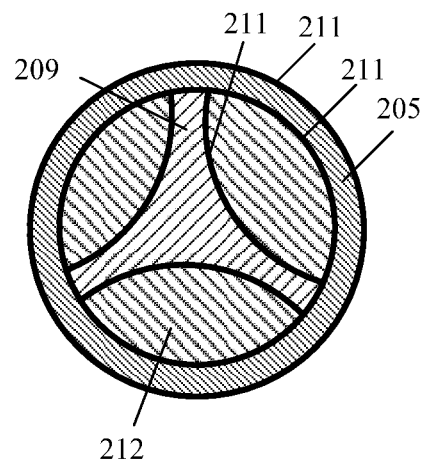

Referring to FIG. 13 and FIG. 14, FIG. 14 is a cross-sectional view of a ring-like wall in FIG. 13 and its interior. An upper electrode 212 is formed in the first opening. The dielectric layer 211 is located between the lower electrode and the upper electrode 212.

The upper electrode 212 may be made of one of tungsten, titanium, nickel, aluminum, platinum, titanium nitrite, N-type polysilicon and P-type polysilicon or a lamination formed by more than two of the groups consisting of the above materials, and may also be made of a compound formed by one or two of a metal nitride and a metal silicide, such as Titanium Nitride, Titanium Silicide, Titanium Silicide, or TiSixNy.

In one embodiment, the semiconductor structure formed includes an upper electrode 212, a lower electrode and a dielectric layer 211 located between the upper electrode 212 and the lower electrode. The upper electrode 212 is continuous, and a plurality of lower electrodes are discrete.

In one embodiment, the second opening is also filled with the upper electrode 212.

The present application further provides a semiconductor structure, referring to FIG. 13 and FIG. 14, including:
a base 201;
a plurality of lower electrodes located on the base 201, the lower electrode including a ring-like wall 205 and a petal-like wall 209, the ring-like wall 205 and the petal-like wall 209 extending along a direction perpendicular to a surface of the base 201, and the petal-like wall 209 dividing the ring-like wall 205 internally into a plurality of discrete first openings 216;
a dielectric layer 211 located on a bottom and a sidewall of the first opening 216; and
an upper electrode 212 filling the opening, the dielectric layer 211 being located between the lower electrode and the upper electrode 212.

In one embodiment, the ring-like wall 205 is made of a different material from the petal-like wall 209. The ring-like wall 205 is made of any one or any combination of a conductive semiconductor material, a conductive polymer material and a conductive amorphous material, and the petal-like wall 209 is made of a conductive material containing a metallic element. In one embodiment, the plurality of lower electrodes are arranged in a honeycomb pattern, and petal-like wall boundaries of the opening located in adjacent lower electrodes are on a same circumference.

In one embodiment, the petal-like wall 209 divides the ring-like wall 205 internally into a plurality of discrete openings, for example, three discrete first openings 216.

In one embodiment, the dielectric layer 211 is further located at a top and an outer wall of the ring-like wall and a top of the petal-like wall.

In one embodiment, the semiconductor structure further includes: a contact pad 202 located in the base 201. The contact pad 202 has a convex portion protruding from the surface of the base 201.

A lower part of the ring-like wall 205 is wrapped around a sidewall of the convex portion.

In one embodiment, a second barrier layer 208 is further provided between the ring-like wall 205 and the petal-like wall 209.

In one embodiment, a second opening 206 is provided between adjacent lower electrodes, the dielectric layer is further located on an outer wall and a top surface of the ring-like wall 205 and a top surface of the petal-like wall 209. The upper electrode 212 is further located in the second opening 206.

It is to be noted that limitations or descriptions of structures in this embodiment (semiconductor structure) the same as or similar to those in the above embodiment (semiconductor structure formation method) are not described in detail below, which can be obtained with reference to the limitations or descriptions in the corresponding part of the above embodiment.

Although the present application has been disclosed as above with preferred embodiments, the present application should not be limited by those embodiments. Any person skilled in the art may make possible changes and modifications to the technical solutions of the present application based on the methods and technical contents disclosed above without departing from the spirit and scope of the present application. Therefore, any simple alterations, equivalent changes and modifications made to the above embodiments based on the technical essence of the present application without departing from the contents of the technical solutions of the present application fall within the protection scope of the technical solutions in the present application.

What is claimed is:

1. A semiconductor structure, wherein the semiconductor structure comprises:
a base;
a plurality of lower electrodes located on the base, the lower electrode comprising a ring-like wall and a petal-like wall, the ring-like wall and the petal-like wall extending along a direction perpendicular to a surface of the base, and the petal-like wall dividing the ring-like wall internally into a plurality of discrete first openings;
a dielectric layer located on a bottom and a sidewall of the first opening; and
an upper electrode filling the first opening, the dielectric layer being located between the lower electrode and the upper electrode.

2. The semiconductor structure according to claim 1, wherein
the ring-like wall and the petal-like wall are made of different materials.

3. The semiconductor structure according to claim 2, wherein
the ring-like wall is made of any one or any combination of a conductive semiconductor material, a conductive polymer material and a conductive amorphous material, and the petal-like wall is made of a conductive material containing a metallic element.

4. The semiconductor structure according to claim 1, wherein the plurality of lower electrodes are arranged in a honeycomb pattern, and petal-like wall boundaries of the first opening located in adjacent lower electrodes are on a same circumference.

5. The semiconductor structure according to claim 4, wherein
the petal-like wall divides the ring-like wall internally into three discrete the first openings.

6. The semiconductor structure according to claim 5, wherein
three the first openings have the same in shape and size.

7. The semiconductor structure according to claim 1, wherein
the dielectric layer is further located at a top and an outer wall of the ring-like wall and a top of the petal-like wall.

8. The semiconductor structure according to claim 7, wherein
a second opening is provided between adjacent lower electrodes, the upper electrode is further located in the second opening.

9. The semiconductor structure according to claim 1, further comprising:
a contact pad located in the base, the contact pad having a convex portion protruding from the surface of the base; and
wrapping a lower part of the ring-like wall around a sidewall of the convex portion.

10. The semiconductor structure according to claim 1, wherein
a second barrier layer is further provided between the ring-like wall and the petal-like wall.

11. The semiconductor structure according to claim 1, wherein
a surface of the petal-like wall is provided with a metal nitride.

* * * * *